United States Patent [19]

Aoai

[11] Patent Number: 4,820,607
[45] Date of Patent: Apr. 11, 1989

[54] PHOTOSOLUBILIZABLE COMPOSITION
[75] Inventor: Toshiaki Aoai, Kanagawa, Japan
[73] Assignee: Fuji Photo Film Co., Ltd., Kanagawa, Japan
[21] Appl. No.: 896,368
[22] Filed: Aug. 14, 1986
[30] Foreign Application Priority Data Aug. 19, 1985 [JP] Japan .................. 60-181420

[51] Int. Cl.$^4$ ............................................. G03C 1/495
[52] U.S. Cl. ..................... 430/190; 430/270; 430/192; 522/154; 522/152; 522/904; 522/57; 522/63; 526/279; 526/261; 526/260
[58] Field of Search ............ 430/270, 192, 190; 526/279, 261, 260; 522/154, 152, 904, 57, 63

[56] References Cited

U.S. PATENT DOCUMENTS 3,661,582  5/1972  Broyde ............................ 430/191
4,279,982  7/1981  Iwasaki et al. ................ 430/270 X
4,307,173  12/1981 Gventer ......................... 430/191 X
4,551,417  11/1985 Suzuki et al. ................. 430/270 X

FOREIGN PATENT DOCUMENTS 0130599  1/1985  European Pat. Off. .
1007835  1/1986  Japan .................................. 430/270

Primary Examiner—Paul R. Michl
Assistant Examiner—Cynthia Hamilton
Attorney, Agent, or Firm—Sughrue, Mion, Zinn, Macpeak & Seas

[57] ABSTRACT

A photosolubilizable composition containing (a) a first compound capable of producing an acid by irradiation with actinic rays and (b) a high molecular weight compound, whose solubility in a developing solution is increased by the action of an acid, and a photosolubilizable composition containing (c) a high molecular weight compound whose solubility in a developing solution is increased by irradiation with actinic radiation, are disclosed. These compositions exhibit high photosensitivity, broad development latitude, and high stability with time.

21 Claims, No Drawings

PHOTOSOLUBILIZABLE COMPOSITION

FIELD OF THE INVENTION

This invention relates to a photosolubilizable composition suitable for the production of lithographic printing plates, proofs for multicolor printing, drawings for overhead projectors, printed circuits, and photomasks.

BACKGROUND OF THE INVENTION

Positively working photosensitive materials which are solubilized by irradiation with actinic rays include orthoquinonediazide compounds. The orthoquinonediazide compounds have been widely used in practice for the production of lithographic printing plates, photoresists, and the like. References can be made to it in many publications, e.g., U.S. Pat. Nos. 2,766,118, 2,767,092, 2,772,972, 2,859,112, 2,907,665, 3,046,110, 3,046,111, 3,046,115, 3,046,118, 3,046,119, 3,046,120, 3,046,121, 3,046,122, 3,046,123, 3,061,430, 3,102,809, 3,106,465, 3,635,709, 3,647,443, etc.

These conventional orthoquinonediazide compounds are decomposed upon irradiation with actinic rays to produce carboxylic acids of 5-membered rings, whereby they become alkali-soluble. Owing to this property, they serve as positively working photosensitive materials, but they also have a defect of insufficient photosensitivity. This arises from the fact that the quantum yield in the photochemical reaction of the orthoquinonediazide compounds does not essentially exceed 1.

Although many attempts have been made to enhance photosensitivity of photosensitive compositions containing the orthoquinonediazide compounds, it has been very difficult to increase photosensitivity of such compositions while retaining their development latitudes. Examples of such attempts are described in U.S. Pat. Nos. 3,661,582, 4,009,003, 4,307,173, etc.

Recently some photosensitive compositions which can work positively without containing orthoquinonediazide compounds have been proposed. One of such compositions is the one containing a polymer compound having an orthonitrocarbinol ester group as disclosed in U.S. Pat. No. 3,849,137. The photosensitivity of this composition is, however, still insufficient for the same reason as in the case of the compositions containing the orthoquinonediazide compounds.

Aside from the above-described methods, there have been proposed a method of enhancing photosensitivity by using a photosensitive system which can be activated by catalytic action, in which application is made of an acid produced upon photolysis inducing a second reaction to thereby solubilize the exposed areas.

Examples of such a photosensitive system include combinations of a compound capable of producing an acid upon photolysis with an acetal or O,N-acetal compound (U.S. Pat. No. 3,779,778), an orthoester or amidoacetal compound (U.S. Pat. No. 4,101,323), a polymer having an acetal or ketal group in its main chain (U.S. Pat. No. 4,247,611), an enol ether compound (U.S. Pat. No. 4,248,957), an N-acyliminocarboxylic acid compound (U.S. Pat. No. 4,250,247), a polymer having an orthoester group in its main chain (U.S. Pat. No. 4,311,782), a silyl ester compound (Japanese Patent Application (OPI) No. 10427/85, the term "OPI" herein used means "unexamined published application") or a silyl ether compound (Japanese Patent Application (OPI) No. 37549/85). These combinations have a possibility of exhibiting high photosensitivities because they have, in principle, quantum yields higher than 1. However, in the case of the systems containing the acetal or O,N-acetal compound or the polymer having an acetal or ketal group in its main chain, the second reaction caused by the acid produced upon photolysis proceeds so slowly that photosensitivity high enough to be suitable for practical use cannot be achieved. On the other hand, in the cases of the systems containing the orthoester or amidoacetal compound, the enol ether compound or the N-acyliminocarboxylic acid compound, photosensitive attained are undoubtedly high, but these compounds are poor in stability with a lapse of time and cannot be preserved for a long period of time. Further, the combination with the polymer having an orthoester group in its main chain, though highly photosensitive, suffers from the disadvantage of a narrow development latitude. The combinations with the silyl ester compound or the silyl ether compound exhibit higher sensitivities and high stability with time as compared with other compounds and polymers, but the stability with time is still insufficient for practical use.

SUMMARY OF THE INVENTION

An object of this invention is to provide a novel photosolubilizable composition free from the above-described problems, i.e., a novel photosolubilizable composition having high photosensitivity and exhibiting broad development latitude.

Another object of this invention is to provide a photosolubilizable composition which exhibits high stability with time, and can, therefore, withstand long-term storage.

A further object of this invention is to provide a photosolubilizable composition which can be easily prepared using a simple process.

As a result of extensive investigations, it has now been found that the above-objects can be accomplished by using a novel photosolubilizable composition as hereinafter described, thus resulting in the present invention.

This invention relates to a photosolubilizable composition containing (a) a first compound capable of producing an acid by irradiation with actinic radiation and (b) a high molecular weight compound, whose solubility in a developing solution is increased by the action of an acid, said high molecular weight compound incorporating at least 1 mol% of a monomer unit represented by formula (I)

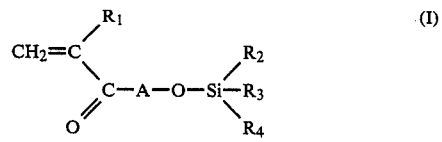

wherein $R_1$ represents a hydrogen atom, a halogen atom or a substituted or unsubstituted alkyl group; $R_2$, $R_3$, and $R_4$ (which may be the same or different) each represents a hydrogen atom, a substituted or unsubstituted alkyl group, a substituted or unsubstituted aryl group, a substituted or unsubstituted aralkyl group or $-OR_5$; $R_5$ represents a substituted or unsubstituted alkyl group, a substituted or unsubstituted aryl group or a substituted or unsubstituted aralkyl group; and A represents a single chemical bond, $-O-R_6-CO-$ or

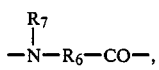

wherein $R_6$ represents a substituted or unsubstituted divalent aliphatic or aromatic hydrocarbon residue; and $R_7$ represents a hydrogen atom, a substituted or unsubstituted alkyl group, a substituted or unsubstituted aryl group, a substituted or unsubstituted aralkyl group or —CO—$R_8$, wherein $R_8$ represents a substituted or unsubstituted alkyl group, a substituted or unsubstituted aryl group or a substituted or unsubstituted aralkyl group; provided that at least one of $R_2$, $R_3$ and $R_4$ represents a group other than the group consisting of a hydrogen atom, a methyl group or —$OR_5$.

This invention further relates to a photosolubilizable composition containing (c) a high molecular weight compound, whose solubility in a developing solution is increased by irradiation with actinic radiation, said high molecular weight compound incorporating at least one monomer unit represented by the above-described formula (I) and at least one monomer unit represented by formula (II)

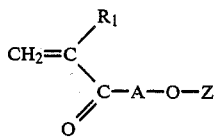

wherein $R_1$ and A are the same as defined above; and Z represents a group capable of producing an acid by irradiation with actinic radiation.

DETAILED DESCRIPTION OF THE INVENTION

In the first embodiment of the present invention, an acid generated from the compound (a) with actinic radiation decomposes the high molecular weight compound (b) which contains an acid-decomposable group derived from the compound of formula (I), and the carboxyl group thus generated renders the high molecular weight compound (b) soluble in an alkaline developing solution.

In the second embodiment of the present invention, a high molecular weight compound (c) contains at least one group which is capable of generating an acid with actinic radiation and which is derived from the compound of formula (II), and at least one groups which is capable of being decomposed by the action of the acid and which is derived from the compound of formula (I), in the same molecule. The high molecular weight compound (c) has the same functions as both the compounds (a) and (b) used in the first embodiment, in one molecule.

In the above-described formula (I), $R_1$ preferably represents a hydrogen atom or a substituted or unsubstituted alkyl group, and more preferably a hydrogen atom or a methyl group. $R_2$, $R_3$, and $R_4$ each preferably represents a substituted or unsubstituted alkyl, aryl, or aralkyl group. $R_5$ preferably represents an alkyl group having from 1 to 8 carbon atoms, or an aryl group having from 6 to 15 carbon atoms. $R_7$ preferably represents a hydrogen atom, an alkyl group having from 1 to 4 carbon atoms or —CO—$R_8$. $R_8$ preferably represents an alkyl group having from 1 to 4 carbon atoms or an aryl group having from 6 to 10 carbon atoms.

In the above-described formula (II), the group capable of producing an acid by irradiation with actinic rays as represented by Z preferably includes groups containing an s-triazine unit substituted with a trihalomethyl group or an oxadiazole unit substituted with a trihalomethyl group.

Specific examples of the monomer unit represented by formula (I) are shown below:

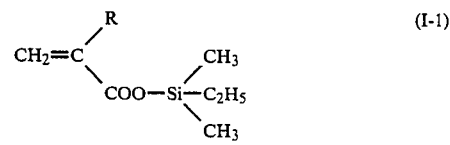

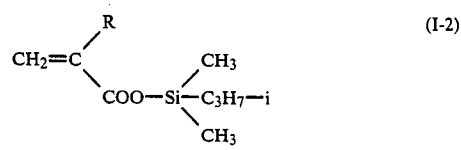

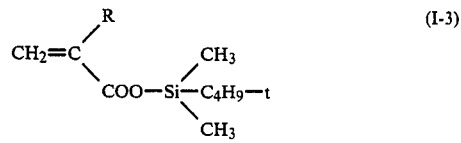

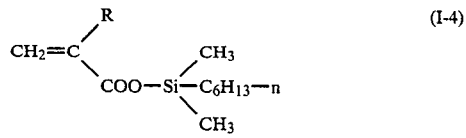

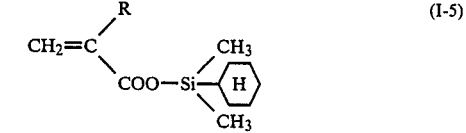

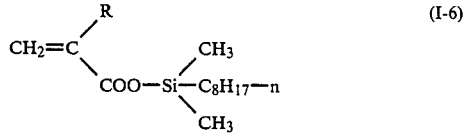

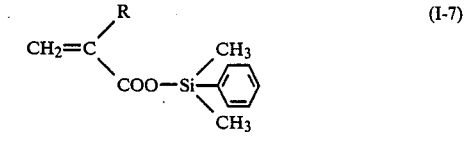

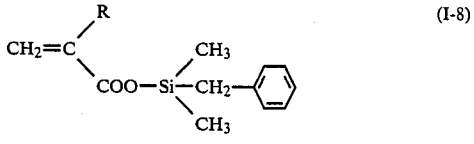

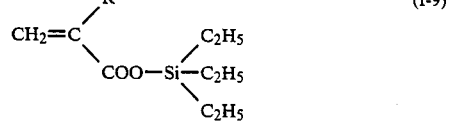

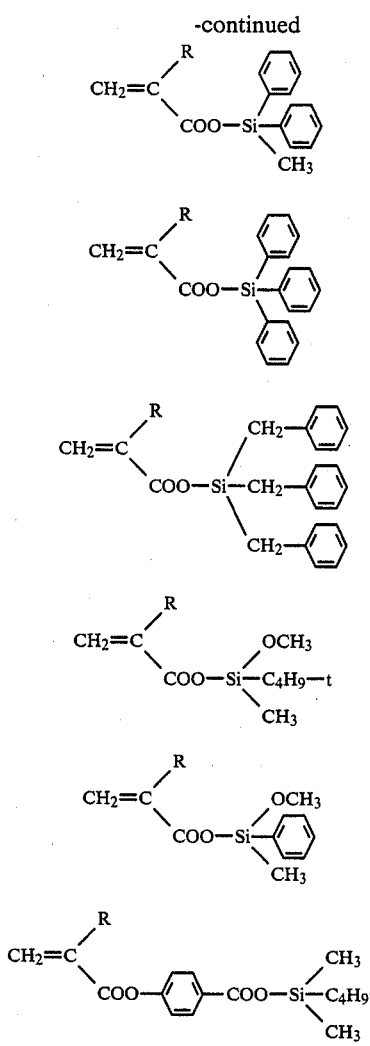
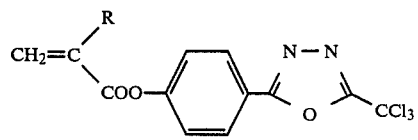
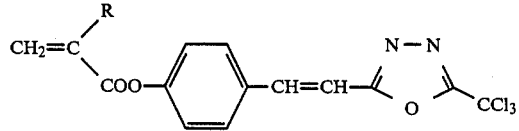
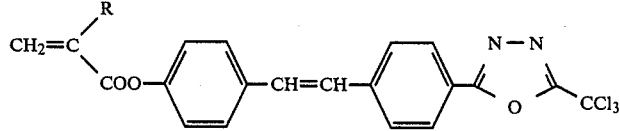
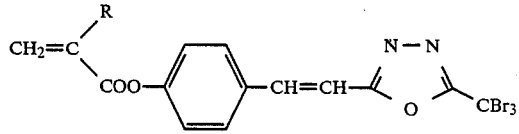
wherein R represents a hydrogen atoms or a methyl group.
Specific examples of the monomer unit represented by formula (II) are shown below:

-continued
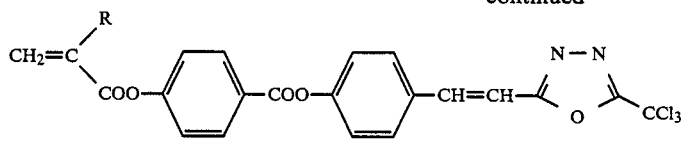 (II-5)
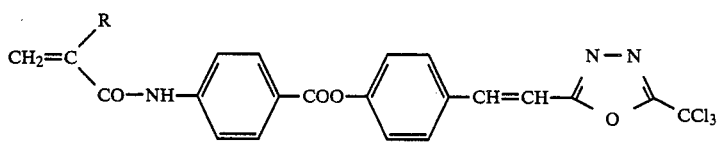 (II-6)
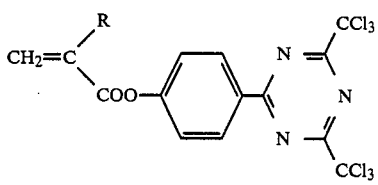 (II-7)
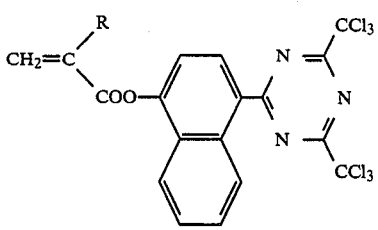 (II-8)
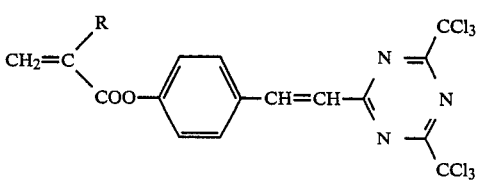 (II-9)
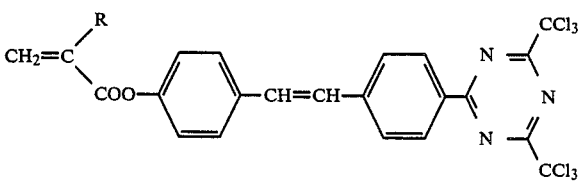 (II-10)
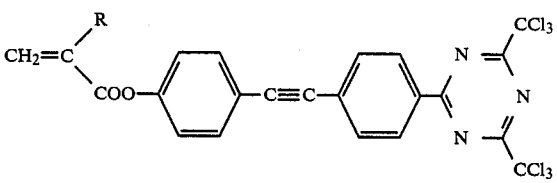 (II-11)
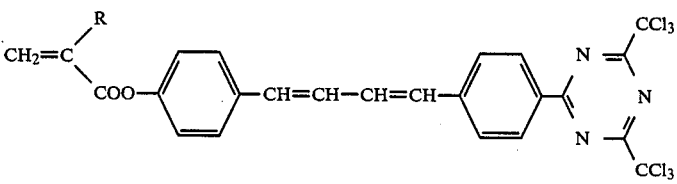 (II-12)
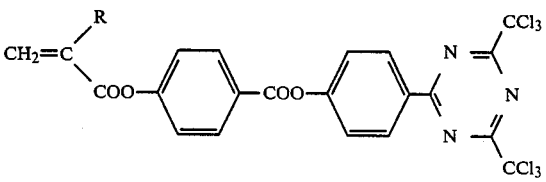 (II-13)

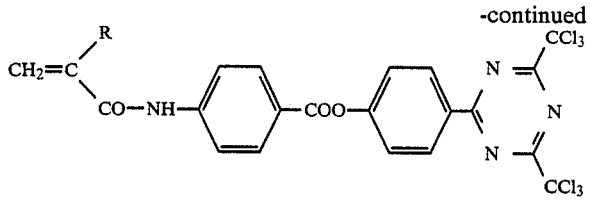

(II-14)

wherein R is as defined above.

The high molecular weight compound (b) which can be used in the photosolubilizable composition according to this invention includes a homopolymer solely comprising the monomer of formula (I), and a copolymer comprising the monomer of formula (I) and one or more of other polymerizable ethylenically unsaturated compounds. Likewise, the high molecular weight compound (c) which can be used in another photosolubilizable composition according to the present invention includes a copolymer composed of the monomer of formula (I) and the monomer of formula (II), and a copolymer further containing one or more of other polymerizable ethylenically unsaturated compounds.

The ethylenically unsaturated compounds which are copolymerizable with the monomers of the present invention include compounds having one addition polymerizable unsaturated bond selected from acrylic esters, acrylamides, methacrylic esters, methacrylamides, allyl compounds, vinyl ethers, vinyl esters, styrenes, crotonic esters, and the like. Specific examples of these compounds are acrylic esters, such as alkyl acrylates, preferably those having from 1 to 10 carbon atoms in the alkyl moiety thereof (e.g., methyl acrylate, ethyl acrylate, propyl acrylate, butyl acrylate, amyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, tetrahydrofurfuryl acrylate, etc.) and aryl acrylates (e.g., phenyl acrylate, etc.); methacrylic esters, such as alkyl methacrylate, preferably those having from 1 to 10 carbon atoms in the alkyl moiety thereof (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate, etc.) and aryl methacrylates (e.g., phenyl metharylate, cresyl methacrylate, naphthyl methacrylate, etc.); acrylamides, such as acrylamide, N-alkylacrylamides (the alkyl group thereof is the one having from 1 to 10 carbon atoms, e.g., a methyl group, an ethyl group, a propyl group, a butyl group, a t-butyl group, a heptyl group, an octyl group, a cyclohexyl group, a benzyl group, a hydroxyethyl group, etc.), N-arylacrylamides (the aryl group thereof includes a phenyl group, a tolyl group, a nitrophenyl group, a naphthyl group, a cyanophenyl group, a hydroxyphenyl group, etc.), N,N-dialkylacrylamides (the alkyl group thereof has from 1 to 10 carbon atoms, e.g., a methyl group, an ethyl group, a butyl group, an isobutyl group, an ethylhexyl group, a cyclohexyl group, etc.), N,N-arylacrylamides (the aryl group includes a phenyl group, etc.), N-methyl-N-phenylacrylamide, N-hydroxyethyl-N-methylacrylamide, N-2-acetamidoethyl-N-acetylacrylamide, etc.; methacrylamides, such as methacrylamide, N-alkylmethacrylamides (the alkyl group thereof is the one having from 1 to 10 carbon atoms, e.g., a methyl group, an ethyl group, a t-butyl group, an ethylhexyl group, a hydroxyethyl group, a cyclohexyl group, etc.), N-arylmethacylamides (the aryl group thereof includes a phenyl group, a hydroxyphenyl group, etc.), N,N-dialkylmethacrylamides (the alkyl group thereof includes an ethyl group, a propyl group, a butyl group, etc.), N,N-diarylmethacrylamides (the aryl group thereof includes a phenyl group, etc.), N-hydroxyethyl-N-methylmethacrylamide, N-methyl-N-phenylmethacrylamide, N-ethyl-N-phenylmethacrylamide, etc.; allyl compounds, such as allyl esters (e.g., allyl acetate allyl caproate, allyl caprylate, allyl laurate, allyl palmitate, allyl stearate, allyl benzoate, allyl acetacetate, allyl lactate, etc.), allyloxyethanol, etc.; vinyl ethers, such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether, etc.), vinyl aryl ethers (e.g., vinyl phenyl ether, vinyl tolyl ether, vinyl chlorophenyl ether, vinyl-2,4-dichlorophenyl ether, vinyl naphthyl ether, vinyl anthranil ether, etc.); vinyl esters, such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetacetate, vinyl lactate, vinyl-β-phenylbutylate, vinylcyclohexylcarboxylate, vinyl benzoate, vinyl salicylate, vinyl chlorobenzoate, vinyl tetrachlorobenzoate, vinyl naphtoate, etc.; styrenes, such as styrene, alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene, etc.), alkoxystyrenes (e.g., methoxystyrene, 4-methoxy-3-methylstyrene, dimethoxystyrene, etc.), halogenostyrenes (e.g., chlorostyrene. dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene, etc.), etc.; crotonic esters, such as alkyl crotonates (e.g., butyl crotonate, hexyl crotonate, glycerin monocrotonate, etc.), etc.; dialkyl itoconates (e.g., dimethyl itaconate, diethyl itaconate, dibutyl itaconate, etc.); dialkyl maleates or fumarates (e.g., dimethyl maleate, dibutyl fumarate, etc.); acrylic acid, methacrylic acid, acrylonitrile, methacrylonitrile, and the like. In general, any other addition polymerizable unsaturated compounds copolymerizable with the compounds of the formula (I) and/or (II) can be used in this invention.

The high molecular weight compound (b) or (c) to be used in the photosolubilizable compositions of the present invention preferably have a weight average molecular weight of from 1,000 to 1,000,000 and more preferably from 5,000 to 1,000,000.

In the high molecular weight compound (c), the molar ratio of the monomer of formula (I) to the monomer unit of formula (II) preferably ranges from 1/0.0001 to 1/10, and more preferably from 1/0.005 to 1/0.5.

The compounds (a) which can be used in the photosolubilizable compositions of the invention and capable of producing an acid upon irradiation with actinic radiation include various known compounds and mixtures. Suitable examples thereof include diazonium, phosphonium, sulfonium, or iodonium salts of $BF_4^-$, $PF_6^-$, $SbF_6^-$, $SiF_6^{2-}$, $ClO_4^-$, etc., organic halogen compounds orthoquinonediazidosulfonyl choloride, and combinations of organometallic compounds and organic halogen compounds. Compounds capable of producing an acid upon photolysis, as described, for example, in U.S. Pat. No. 3,779,778 and West German Pat. No. 2,610,842, can also be used in the photosolubilizable compositions of the invention as as acid-producing component. In addition, compounds which are intended to provide a visible contrast between unexposed areas and exposed areas upon exposure when used in combination with an appropriate dye, as disclosed in U.S. Pat. Nos. 4,279,982 and 4,399,210, can also be utilized as the acid-producing component in the compositions of the present invention.

Of the above-described compounds capable of producing acids by photolysis, the particularly preferred are orthoquinonediazidosulfonyl chloride, s-triazine derivatives substituted with a halomethyl group and oxadiazole derivatives substituted with a halomethyl group.

The weight ratio of the acid-producing compound (a) to the high molecular weight compound (b) in the photosolubilizable composition of the invention preferably ranges from 0.001/1 to 2.1, and more preferably from 0.01/1 to 0.8/1.

The photosolubilizable compositions according to the present invention preferably contain an alkali-soluble resin. Suitable alkali-soluble resins to be used include novolak type resins, with specific examples including a phenol-formaldehyde resin, an o-cresol-formaldehyde resin, an m-cresol-formaldehyde resin, etc. Better results can be obtained by using a combination of these phenol resins and condensates of phenols or cresols substituted by an alkyl group having from 3 to 8 carbon atoms and formaldehyde, e.g., a t-butylphenol-formaldehyde resin. Such an alkali-soluble resin as described above can be used in an amount of from about 10 to about 90% by weight, and preferably from 40 to 80% by weight, based on the total weight of the photosolubilizable composition.

If desired, the photosolubilizable compositions of the present invention can contain dyes, pigments, plasticizers, compounds which increase acid-production efficiency of the acid-producing compounds (so-called sensitizers), and the like. The dyes which can be used suitably include oil-soluble dyes and the basic dyes. Specific examples of these dyes are Oil Yellow #101, Oil Yellow #130, Oil Pink #312, Oil Green BC, Oil Blue BOS, Oil Blue #603, Oil Black BY, Oil Black BS, Oil Black T-505 (the foregoing are products of Orient Chemical Industries, Ltd.), Crystal Violet (CI 42555), Methyl Violet (CI 52435), Rhodamine B (CI 45170B), Malachite Green (CI 42000), Methylene Blue (CI 52015), etc.

The photosolubilizable composition of the invention is dissolved in an appropriate solvent capable of dissolving all of the above-described components, and the solution is coated on a support. Examples of the solvent to be used include ethylene dichloride, cyclohexanone, methyl ethyl ketone, ethylene glycol monomethyl ether, ethylene glycol monoethyl ether, 2-methoxyethyl acetate, toluene, ethyl acetate, and the like. These solvents may be used either individually or in combinations of two or more thereof. A concentration of the solid content inclusive of additives in such a solvent is from 2 to 50% by weight, with that of the essential components of the present invention, i.e., the compound (a) plus the compound (b), or the compound (c), ranging from 0.1 to 25% by weight on a solid basis.

The coverage of the coating composition varies depending on its end use. For example, when applied to a presensitized printing plate, the coating composition is generally coated in an amount of from 0.5 to 3.0 $g/m^2$ on a solid base. Although photosensitivity achieved increases with a decrease in coverage, physical properties of the resulting photosensitive film are deteriorated.

Suitable examples of the support which can be employed in producing a lithographic printing plate using the photosolubilizing composition of the invention include an aluminum plate having been rendered hydrophilic, such as a silicate-processed aluminum plate, an anodically oxidized aluminum plate, a grained aluminum plate and a silicate-electro-deposited aluminum plate; and, in addition, a zinc plate, a stainless steel plate, a chromium-processed steel plate, a plastic film having been rendered hydrophilic, and a sheet of paper.

Suitable examples of the support which can be employed in producing proofs for printing and films for a second original used in an overhead projector include transparent plastic films, such as a polyethylene terephthalate film, a triacetate film, etc., and these plastic films whose surfaces have been chemically or physically matted. Suitable examples of the support which can be used in producing photomask films include an aluminum-, aluminum alloy-, or chromium-vapor deposited polyethylene terephthalate film and a polyethylene terephthalate film on which a colored layer has been provided. Further, in producing photoresists, various kinds of supports other than those enumerated above, e.g., a copper plate, a copper-plated plate, a glass plate, etc., can be used.

Light sources of actinic rays which can be used in the present invention include a mercury lamp, a metal halide lamp, a xenon lamp, a chemical lamp, a carbon arc lamp, etc. Scanning irradiation with high energy beams (laser beams or electron beams) can also be employed. Such laser beams include a helium-neon laser, an argon laser, a krypton laser, a helium-cadmium laser, etc.

An appropriate developing solution for the photosolubilizable composition of the invention is an aqueous solution of an inorganic alkali agent, such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate, aqueous ammonia, and the like. Such an alkali agent is used in concentrations of form 0.1 to 10% by weight, and preferably from 0.5 to 5% by weight, based on the total weight of the developing solution.

If desired, the developing solution may further contain a surface active agent or an organic solvent, e.g., alcohols.

This invention is now illustrated in greater detail with reference to the following examples, but it should be understood that they are not intended to limit the present invention.

SYNTHESIS EXAMPLE 1

Synthesis of Copolymer of Compound (I-7) (R=methyl group) and Benzyl Methacrylate In 120 ml of 2-methoxyethanol were dissolved 35.3 g (0.160 mol) of dimethylphenylsilyl methacrylate and 7.1 g (0.040 mol) of benzyl methacrylate. After the mixture was heated to 70° C. under a nitrogen stream, 0.25 g of $\alpha,\alpha'$-azobisisobutyronitrile was added thereto to effect polymerization for 8 hours. After completion of the reaction, the reaction mixture was poured into 3 liters of water while stirring, and the white precipitate thus formed was collected by filtration and dried to obtain 38.3 g of the titled copolymer.

SYNTHESIS EXAMPLE 2

Synthesis of Copolymer of Compound (I-7; R=methyl group), Compound (II-2; R=methyl group) and Benzyl Methacrylate In 120 ml of 2-methoxyethanol were dissolved 33.5 g (0.152 mol) of Compound (I-7) (R=$CH_3$), 3.8 g (0.01 mol) of Compound (II-2) (R=$CH_3$) and 6.7 g (0.038 mol) of benzyl methacrylate. After the solution was heated to 70° C. under a nitrogen stream, 0.25 g of $\alpha,\alpha'$-azobisisobutyronitrile was added thereto to effect polymerization for 8 hours. After completion of the reaction, the reaction mixture was poured into 3 liters of water while stirring, and the white precipitate thus formed was collected by filtration and dried to provide 40.2 g of the desired copolymer.

EXAMPLE 1

A 0.24 mm thick 2S aluminum plate was degreased by dipping in a 10 wt% aqueous solution of sodium tertiary phosphate kept at 80° C. for 3 minutes. The aluminum plate was grained with a nylon brush, etched with sodium aluminate for about 10 seconds and then subjected to desmutting treatment with a 3 wt% aqueous solution of sodium hydrogensulfate. The resulting aluminum plate was anodically oxidized for 2 minutes in 20 wt% sulfuric acid by passing therethrough an electric current at a density of 2 A/$dm^2$ to prepare an aluminum support.

Photosensitive solutions (A)-1 to (A)-4 were prepared according to Formulation (A) shown below, in which the photosolubilizable high molecular weight compound (b) of the present invention indicated in Table 1 was used.

| Formulation (A): | |
| --- | --- |
| Photosolubilizable high molecular weight compound (b) | 0.40 g |
| Cresol-formaldehyde novolak resin | 1.1 g |
| 2-(p-Methoxyphenyl)-4,6-bistrichloromethyl-s-triazine | 0.05 g |

| -continued | |
| --- | --- |
| Formulation (A): | |
| Oil Blue #603 (produced by Orient Chemical Industries, Ltd.) | 0.01 g |
| Ethylene dichloride | 10 g |
| Methyl cellosolve | 10 g |

Each of the resulting photosensitive solutions was coated on the above prepared aluminum support to a dry coverage of 1.5 g/$m^2$ and dried at 100° C. for 2 minutes to obtain presensitized printing plate precursors (A)-1 to (A)-4.

For comparison, a presensitized printing plate precursor (B) was prepared in the same manner as described above, but using a photosensitive solution having Formulation B shown below:

| Formulation B: | |
| --- | --- |
| Condensate of cresol-formaldehyde novolak resin and 1,2-naphthoquinone-2-diazido-5-sulfonyl chloride | 0.45 g |
| Cresol-formaldehyde novolak resin | 1.1 g |
| 1,2-Naphthoquinone-2-diazido-4-sulfonyl chloride | 0.02 g |
| Oil Blue #603 (produced by Orient Chemical Industries, Ltd.) | 0.01 g |
| Ethylene dichloride | 10 g |
| Methyl cellosolve | 10 g |

A gray scale having a density difference of 0.15 was placed in close contact with the photosensitive layer of each printing plate precursor, and was exposed by means of a carbon arc lamp of 30 ampere placed at a distance of 70 cm.

In order to prove superiority of the compositions of the present invention in photosensitivity, each of the thus exposed plates (A)-1 to (A)-4 and (B) was subjected to dip development in a 8-fold diluted aqueous solution of DP-4 (trademark for developer produced by Fuji Photo Film Co., Ltd.) at 25° C. for 60 seconds, and an exposure time at which the area corresponding to the fifth step of the gray scale having a density difference of 0.15 became completely clear was determined. The results obtained are shown in Table 1 below.

TABLE 1

| Presensitized Printing Plate Precursor | Compound (b) Used | Exposure Time (sec) |
| --- | --- | --- |
| (A)-1 | Copolymer of Compound (I-3; R = $CH_3$) and benzyl methacrylate (molar ratio = 8:2) | 30 |
| (A)-2 | Copolymer of Compound (I-5; R = $CH_3$) and benzyl methacrylate (molar ratio = 8:2) | 28 |
| (A)-3 | Copolymer of Compound (I-7; R = $CH_3$) and benzyl methacrylate (molar ratio = 8:2) | 40 |
| (A)-4 | Copolymer of Compound (I-17; R = $CH_3$) and benzyl methacrylate (molar ratio = 8:2) | 33 |
| (B) | Comparison | 50 |

Every compound (b) shown in Table 1 had a weight average molecular weight of from 20,000 to 50,000 as measured by gel-permeation chromatography (GPC) (polystyrene standard).

As can be seen from Table 1 above, the presensitized printing plate precursors (A)-1 to (A)-4 in which the compounds of the present invention were used had shorter exposure times that mean higher photosensitivities than that of the comparative sample (B).

EXAMPLE 2

Comparative presensitized printing plate precursors (C)-1 and (C)-2 were prepared in the same manner as described in Example 1, but using Formulation C shown below:

| Photosensitive Solution Formulation C: | |
| --- | --- |
| Silyl ester compound (C)-1 or (C)-2 having the following formula (disclosed in Japanese Patent Application (OPI) No. 10247/85) | 0.40 g |
| Cresol-formaldehyde novolak resin | 1.1 g |
| 2-(p-Methoxyphenyl)-4,6-bistrichloro-methyl-s-triazine | 0.05 g |
| Oil Blue #603 (produced by Orient Chemical Industries, Ltd.) | 0.01 g |
| Ethylene dichloride | 10 g |
| Methyl cellosolve | 10g |

(C)-1:

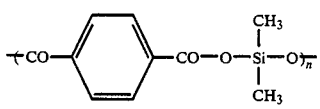

Weight average molecular weight $\overline{M}w = 2,100$
(GPC; polystyrene standard)

(C)-2:

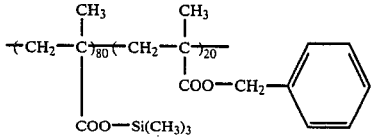

$\overline{M}w = 30,000$ (GPC: polystyrene standard)

In order to demonstrate superiority of the present invention in stability with time, each of the presensitized printing plate precursors (A)-1 to (A)-4 and B as prepared in Example 1 and (C)-1 and (C)-2 was allowed to stand under conditions of 45° C. in temperature and 75% in relative humidity for 3 days. Before and after the standing, a gray scale having a density difference of 0.15 was placed in intimate contact with the photosensitive layer of the printing plate precursor, and was exposed to light by means of a carbon arc lamp of 30 ampere placed at a distance of 70 cm for 30 seconds. The exposed plate was developed in the same manner as described in Example 1. A difference in step number of the gray scale at which the corresponding area of the plate became completely clear between the case of no standing and the case of 3 days' standing was determined. The results obtained are shown in Table 2 below.

Table 2

| Presensitized Printing Plate Precursor | Difference in Step Number of Gray Scale Between Before And After 3 Days' Standing (step) |
| --- | --- |
| (A)-1 | 0.5 |
| (A)-2 | 0.5 |
| (A)-3 | 0.5 |
| (A)-4 | 0.5 |
| (B) | 1.0 |
| (C)-1 | 2.5 |
| (C)-2 | 1.0 |

As can be seen from Table 2, the presensitized printing plate precursors using the compounds of the present invention are excellent in stability with time.

EXAMPLE 3

Presensitized printing plate precursors (A)-5 to (A)-7 were prepared in the same manner as described in Example 1, except using a photosensitive solution having Formulation A' shown below. The photosolubilizable high molecular weight compound (c) used in Formulation A' is shown in Table 3.

| Formulation A': | |
| --- | --- |
| Photosulubilizable high molecular weight compound (c) | 0.45 g |
| Cresol-formaldehyde novolak resin | 1.1 g |
| Oil Blue #603 (produced by Orient Chemical Industries, Ltd.) | 0.01 g |
| Ethylene dichloride | 10 g |
| Methyl cellosolve | 10 g |

Each of the presensitized printing plate precursors (A)-5 to (A)-7, (B) as prepared in Example 1 and (C)-2 as prepared in Example 2 was exposed to light and dip-developed in the same manner as in Example 1, and an exposure time at which the area corresponding to the fifth step of the gray scale became completely clear was determined in the same manner as in Example 1. The results obtained are shown in Table 3. (In each of Compounds I-2, I-3, I-4, II-2, II-7 and II-8 shown in Table 3, R represents a methyl group.)

TABLE 3

| Presensitized Printing Plate Precursor | Compound (c) Used | Exposure Time (sec) |
| --- | --- | --- |
| (A)-5 | Copolymer of Compound (I-2), Compound (II-2) and benzyl methacrylate (molar ratio = 76/5/19) | 20 |
| (A)-6 | Copolymer of Compound I-3), Compound (II-7) and benzyl methacrylate (molar ratio = 76/5/19) | 23 |
| (A)-7 | Copolymer of Compound (I-4), Compound (II-8) and benzyl methacrylate (molar ratio = 76/5/19) | 18 |
| (B) | Comparison | 50 |
| (C)-2 | Comparison | 25 |

Every compound (c) in Table 3 above had a weight average molecular weight of from 20,000 to 40,000 as measured by GPC (polystyrene standard).

The results of Table 3 above prove that the presensitized printing plate precursors in which the compounds of the present invention are used have shorter exposure times, i.e., higher sensitivities, than those of comparative samples (B) and (C)-2. It can also be seen from a comparison between samples (A)-5 and (C)-2 that the compound of the present invention having both a silyl ester group and a group capable of producing an acid by irradiation with actinic rays in the same molecular contributes greatly to the increase in photosensitivity, compared with the system in which these two functions are produced by different compounds.

EXAMPLE 4

In order to demonstrate the superiority of the present invention in development latitude, a gray scale having a density difference of 0.15 was placed in intimate contact with the photosensitive layer of each of the presensitized printing plate precursors (A)-5 to (A)-7 as prepared in Example 3, (B) as prepared in Example 1 and (C)-2 as prepared in Example 2, followed by exposure to light emitted from a carbon arc lamp of 30 ampere placed at a distance of 70 cm over 30 seconds. The exposed plate was then developed with the same developer as used in Example 1 at 25° C. for 60 seconds or 3 minutes. A difference in step number of the gray scale at which the corresponding area became completely clear between the case of 60 seconds' development and the case of 3 minutes' development was determined. The results obtained are shown in Table 4.

TABLE 4

| Presensitized Printing Plate Precursor | Difference in Step Number of Gray Scale Between Areas Cleared by 3 Minutes' and 60 Seconds' Development, Respectively (step) |
|---|---|
| (A)-5 | 1.0 |
| (A)-6 | 0.5 |
| (A)-7 | 0.5 |
| (B) | 1.5 |
| (C)-2 | 1.5 |

As can be seen from Table 4, the presensitized printing plate precursors prepared using the compounds of the present invention encounter smaller differences in the gray scale step number corresponding to the cleared area; that is, they are excellent in development latitude, compared with the comparative samples (B) and (C)-2. Further, a comparison between samples (A)-5 and (C)-2 reveals that the photosolubilizable high molecular weight compound of the invention which has both a silyl ester group and a group capable of producing an acid upon irradiation of actinic rays in the same molecule contributes greatly to the improvement of development latitude, compared with the system in which these two functions are separately produced by different compounds.

While the invention has been described in detail and with reference to specific embodiments thereof, it will be apparent to one skilled in the art that various changes and modifications can be made therein without departing from the spirit and scope thereof.

What is claimed is:

1. A photosolubilizable composition containing (a) a first compound capable of producing an acid by irradiation with actinic radiation and (b) a high molecular weight compound, whose solubility in a developing solution is increased by the action of an acid, said high molecular weight compound incorporating at least 1 mol% of a monomer unit represented by formula (I)

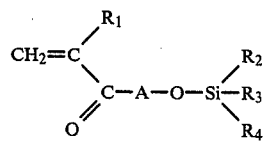

wherein $R_1$ represents a hydrogen atom, a halogen atom or an alkyl group; $R_2$, $R_3$, and $R_4$ each represents a hydrogen atom, an alkyl group, an aryl group or —$OR_5$; $R_5$ represents an alkyl group or an aryl group; and A represents a single chemical bond, —O—$R_6$—CO— or $$-N-R_6-CO-,$$
$$\phantom{-N}|\phantom{R_6-CO-}$$
$$\phantom{-N-R_6-CO}R_7$$

wherein $R_6$ represents a divalent aliphatic or aromatic hydrocarbon residue; and $R_7$ represents a hydrogen atom, an alkyl group, an aryl group or —CO—$R_8$, wherein $R_8$ represents an alkyl group or an aryl group; provided that at least one of $R_2$, $R_3$ and $R_4$ represents a group other than the group consisting of a hydrogen atom, a methyl group or —$OR_5$.

2. A photosolubilizable composition as in claim 1, wherein $R_1$ represents a hydrogen atom, or an alkyl group.

3. A photosolubilizable composition as in claim 1, wherein $R_1$ represents a hydrogen atom or a methyl group.

4. A photosolubilizable composition as in claim 1, wherein said first compound (a) is orthoquinonediazidosulfonyl chloride, an s-triazine derivative substituted by a halomethyl group, or an oxadiazole derivative substituted by a halomethyl group.

5. A photosolubilizable composition as in claim 1, wherein said high molecular weight compound (b) is a copolymer composed of the monomer unit represented by formula (I) and an ethylenically unsaturated compound.

6. A photosolubilizable composition as in claim 1, wherein said high molecular weight compound (b) has a weight average molecular weight of from 1,000 to 1,000,000.

7. A photosolubilizable composition as in claim 6, wherein said high molecular weight compound (b) has a weight average molecular weight of from 5,000 to 1,000,000.

8. A photosolubilizable composition as in claim 1, wherein the weight ratio of the first compound (a) to the high molecular weight compound (b) is from 0.001/1 to 2/1.

9. A photosolubilizable composition as in claim 8, wherein the weight ratio of the first compound (a) to the high molecular weight compound (b) is from 0.01/1 to 0.8/1.

10. A photosolubilizable composition as in claim 1, wherein said composition further contains an alkali-soluble resin.

11. A photosolubilizable composition as in claim 10, wherein said alkali-soluble resin is present in an amount of from 10 to 90% by weight based on the total weight of the composition.

12. A photosolubilizable composition containing a high molecular weight compound, whose solubility in a developing solution is increased by irradiation with actinic radiation, said high molecular weight compound incorporating at least one monomer unit represented by formula (I)

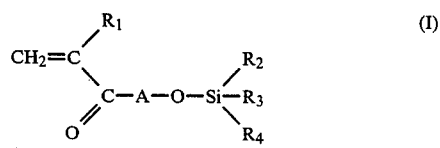

wherein $R_1$ represents a hydrogen atom, a halogen atom or an alkyl group; $R_2$, $R_3$, and $R_4$ each represents a hydrogen atom, an alkyl group, an aryl group, or —$OR_5$; $R_5$ represents an alkyl group or an aryl group; and A represents a single chemical bond,

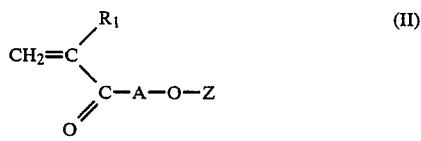

wherein $R_6$ represents a divalent aliphatic or aromatic hydrocarbon residue; and $R_7$ represents a hydrogen atom, an alkyl group, an aryl group or —CO—$R_8$, wherein $R_8$ represents an alkyl group or an aryl group; provided that at least one of $R_2$, $R_3$ and $R_4$ represents a group other that the group consisting of a hydrogen atom, a methyl group or —$OR_5$;

and at least one monomer unit represented by formula (II)

$$CH_2=C\begin{matrix}R_1\\C-A-O-Z\\\|\\O\end{matrix} \quad (II)$$

wherein $R_1$ and A are the same as defined above; and Z represents a group capable of producing an acid by irradiation with actinic radiation.

13. A photosolubilizable composition as in claim 12, wherein $R_1$ represents a hydrogen atom, or an alkyl group.

14. A photosolubilizable composition as in claim 12, wherein $R_1$ represents a hydrogen atom, or a methyl group.

15. A photosolubilizable composition as in claim 12, wherein Z in formula (II) is a group containing an s-triazine unit substituted with a trihalomethyl group or a group containing an oxadiazole unit substituted with a trihalomethyl group.

16. A photosolubilizable composition as in claim 12, wherein a molar ratio of the monomer unit represented by formula (I) to the monomer unit represented by formula (II) is from 1/0.0001 to 1/10.

17. A photosolubilizable composition as in claim 12, wherein the molar ratio of the monomer unit of formula (I) to the monomer unit of formula (II) is from 1/0.005 to 1/0.5.

18. A photosolubilizable composition as in claim 12, wherein said high molecular weight compound has a weight average molecular weight of from 1,000 to 1,000,000.

19. A photosolubilizable composition as in claim 12, wherein said high molecular weight compound has a weight average molecular weight of from 5,000 to 1,000,000.

20. A photosolubilizable composition as in claim 12, wherein said composition further contains an alkali-soluble resin.

21. A photosolubilizable composition as in claim 20, wherein said alkali-soluble resin is present in an amount of from 10 to 90% by weight based on the total weight of the composition.

* * * * *